Figure 1:
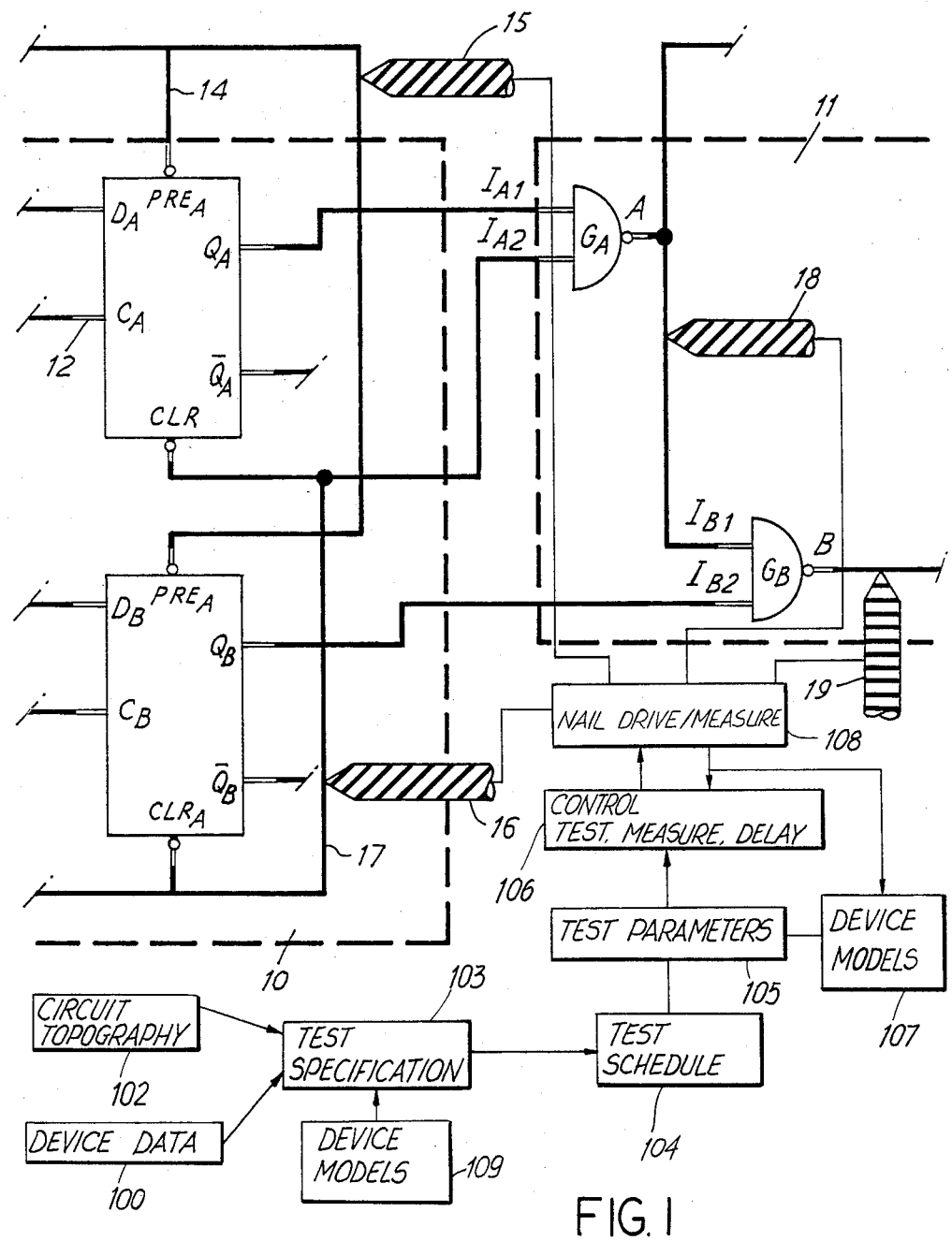
Figure 2:
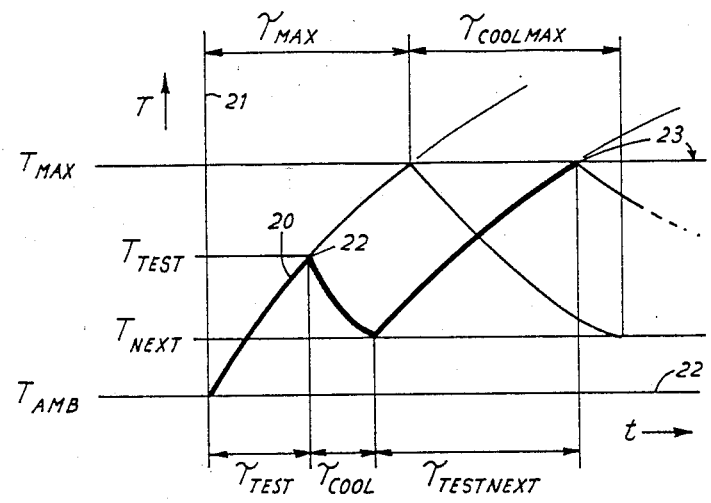
Figure 5:
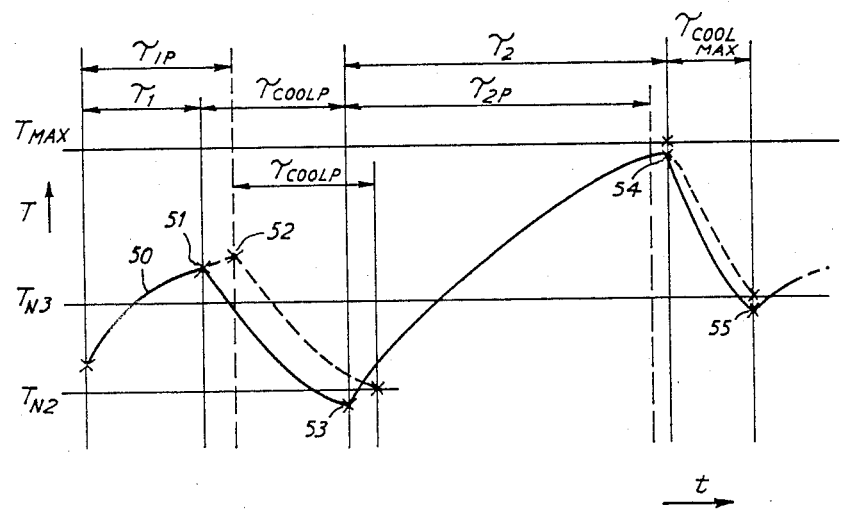
Figure 3:
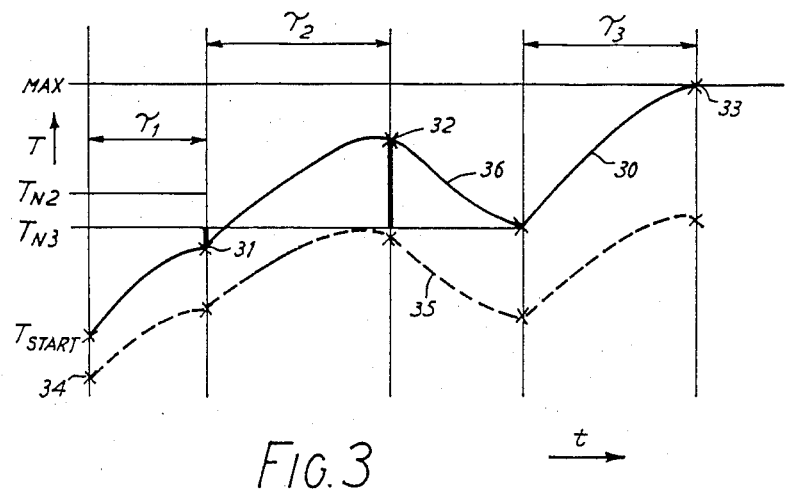
Figure 4:
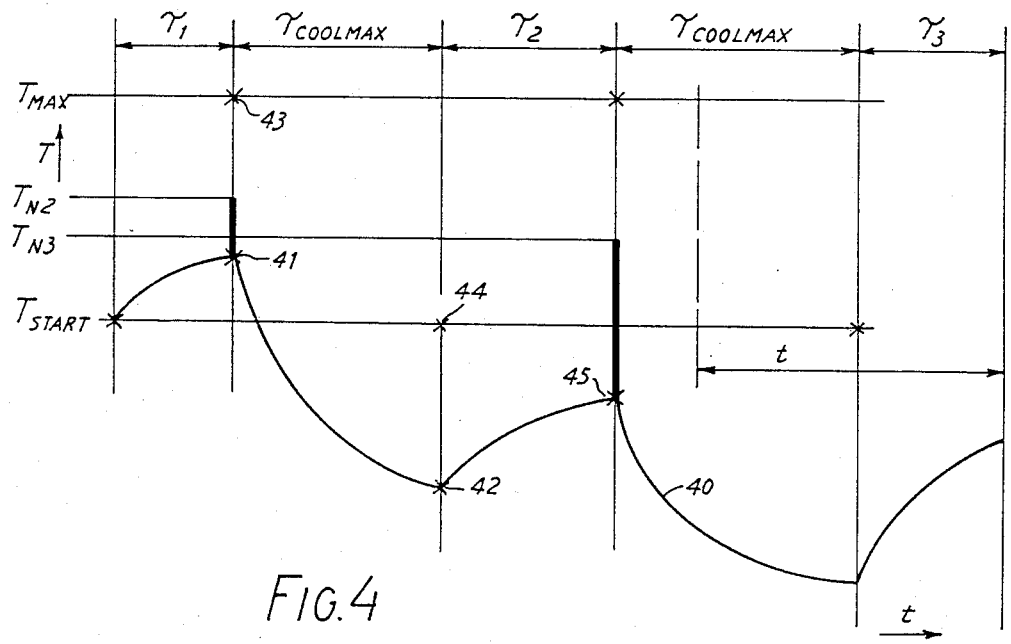

United States Patent [19]
Oliver et al.

[11] Patent Number: 4,827,208
[45] Date of Patent: May 2, 1989

[54] CIRCUIT TESTERS

[75] Inventors: Martin J. Oliver, Poole; Kevin E. Brazier; Stephen R. Boote, both of Wimborne, all of England

[73] Assignee: Membrain Limited, Wimborne, England

[21] Appl. No.: 13,886

[22] Filed: Feb. 12, 1987

[30] Foreign Application Priority Data

Feb. 14, 1986 [GB] United Kingdom ............... 8603665

[51] Int. Cl.⁴ .......................................... G01R 15/12
[52] U.S. Cl. ............................. 324/73 R; 324/158 R; 324/73 AT; 371/20; 371/25
[58] Field of Search ............ 324/158 R, 73 R, 158 F, 324/158 T, 73 AT; 371/20, 15, 25

[56] References Cited

U.S. PATENT DOCUMENTS

| | | | |
|---|---|---|---|
| 3,870,953 | 3/1975 | Boatman et al. | 324/158 T |
| 4,117,400 | 9/1978 | Feldman | 324/73 R X |
| 4,340,859 | 7/1982 | Farley | 324/158 R X |
| 4,439,858 | 3/1984 | Petersen | 324/73 AT |
| 4,459,693 | 7/1984 | Prang et al. | 324/73 R X |
| 4,481,627 | 11/1984 | Beauchesne et al. | 324/73 R |
| 4,556,840 | 12/1985 | Russell | 324/73 R |
| 4,588,945 | 5/1986 | Groves et al. | 324/73 R |

OTHER PUBLICATIONS

Kett; "A Software Programmable Digital System at Low Cost"; Metropole Convention Centre, Brighton, New Developments in Automatic Testing; Nov. 30--Dec. 2, 1977.

Primary Examiner—Reinhard J. Eisenzopf
Assistant Examiner—Vinh P. Nguyen
Attorney, Agent, or Firm—Ladas & Parry

[57] ABSTRACT

In circuit testers, notably automatic test equipment for the in circuit testing of digital devices, overheating damage can result if outputs are repeatedly "overdriven", that is, while applying a test input to a first device, an output of a second connected device is forced into a state contrary to that it would normally adopt. Damage is avoided by enforcing a cooling interval between overdriving tests based upon a list of parameters representative of the overdriven device and its environment. In order to reduce the overall test time, a parameter is based on a measurement derived from a circuit of the type under test. A first test results in device heating to a value. A cooling interval is enforced so that a subsequent test which results in further heating of the device, may be made without exceeding device maximum allowable temperature $T_{max}$.

12 Claims, 3 Drawing Sheets

CIRCUIT TESTERS

The present invention relates to circuit testers, and in particular to circuit testers for performing a device level in-circuit test on a digital device.

In production of electrical circuits, such as circuits produced by means of mounting devices on a board which carries an interconnecting pattern, it is advantageous to test finished circuits. There is a demand for high speed testing, and this has led to automatic test equipment (ATE) for board assessment. Increasingly there is a trend toward equipment which tests not the overall operation of the board by applying signals to its external inputs and assessing external outputs with respect to expected output but the performance of individual devices by applying inputs directly thereto and assessing outputs directly therefrom. For this, connection to internal circuit nodes is required and may be achieved for example by the use of a 'bed-of-nails' fixture, having a plurality of pins which can be made to contact board interconnections at various positions. With such a fixture, inputs may be introduced directly to device inputs and outputs taken directly from device outputs to facilitate testing of that device by application of a predetermined test pattern of inputs and output assessment sufficient to fully test the device.

Unfortunately, because of the existing device interconnection the application of inputs is often in conflict with the preferred state of an input by virtue of its coupling to an upstream output. Thus in order to test the device of interest it may be necessary to overdrive an upstream device output. Effectively this involves forcing a reverse current through the upstream device to overcome its preferred state and this can cause device damage by various mechanism, including direct junction heating or, where several outputs of a single device are simultaneously overdriven, in the same sense, by excessive bondwire current flow in the power supply line by virtue of the cumulative effect of the overdriving currents which sum in the supply lead. However, whatever the mechanism it is generally the highest temperature reached which determines the severity of damage.

Since temperature cannot be measured directly, a theoretical model may be used to compute a prediction of temperature rise. Accordingly, heating models have been developed which are a function of overdriving current and time. Since current can be estimated and the test duration is known, the temperature rise of overdriven devices may be estimated. An absolute maximum allowable device temperature is specified by the device manufacturer, so using the estimated temperature rise, a maximum allowable initial device temperature may be specified.

Clearly if this initial maximum is below the present temperature of the device, the test is too long and cannot be performed safely. In such circumstances the device must be allowed to cool to at least the maximum initial temperature before the test can be commenced, which means that the commencement of the test must be delayed. Such a delay can sometimes be achieved by scheduling tests such that a particular device is not overdriven repeatedly, however often this cannot be avoided, for example where a device enable input must be forced during the entire test pattern of a device. One solution adopted in such a circumstance is to impose a test 'duty-cycle', wherein an inactive cool-down period which is a fixed proportion of the variable test time is imposed after a test. With demands for increased testing throughput, this solution may introduce an increasingly unacceptable time overhead into ATE operation, and a search for other approaches is underway.

One alternative solution is to specify the variable delay interval not as a function of the test as performed, but as a function of the device, and the time it will require to cool to the maximum initial start temperature for the test. This approach leads to the insertion of a delay interval before each test. Unfortunately, since the temperature of the device at the start of the delaying interval is an unknown, an assumption must be made. The only assumption that may be safely made is that the device has to cool from its maximum allowable temperature before each test. This regime, although in most cases reducing the overall time required for a unconditionally safe device test pattern to be performed still has a number of problems. Clearly in most cases the device will not reach its maximum allowable temperature as a result of a previous test, and a waiting interval longer than necessary will consequently be specified. A particularly serious drawback of this regime is that a cool down waiting interval will be enforced before a test even if the overdriven device is already below the maximum initial start temperature for that test, when infact no delay is required at all.

Present day ATE is configured to operate in two basic modes, a test specification mode, and a test performance mode.

In the test specification mode, ATE is loaded with circuit topography and device locations 102. Next the test patterns to test each individual device must be specified 100. Normally, these are held in ATE data files and are available as library routines to be inserted into the test specification en bloc. Occasionally, devices not in the library will be encountered, but normally an ATE mode which allows a component test pattern to be established for an unknown device may be entered. Once established, it is as though the test pattern had come from the library of which it may now form part.

The ATE is also programmed to assess or invite an operator to assess the need for the placement of guard signals, that is signals applied purely to prevent unwanted component interactions.

In many machines, once a test has been specified as above, the test performance mode may be entered for multiple repetition on boards to be tested. However, in some machines a further mode is available, which allows some analysis to be performed on the specified test to locate potentially damaging tests, which essentially involves identifying tests wherein outputs are overdriven and enforcing either duty-cycle or pre-test delay as described above.

From the foregoing brief description, a number of features of prior art ATE will be appreciated. In particular it will be appreciated that an entire test is specified in advance of test execution based on device related stored data. This data may itself derive from previous analysis based on heating and cooling models, or on analysis performed during the test specification but in either case only data which can be stored as general device indexed data can be used in test specification. It will be realised that such machines naturally lend themselves to adaption for pre-testing delay in the test specification, provided access to the libraty data of devices other than that on test is allowed, since the cool-down time from absolute maximum before an output may be overdriven may be straightforwardly stored as a device parameter.

It will be realised that the pre-testing delay approach probably represents the optimum that can be achieved with prior art ATE. The present invention has involved a fundamental study of the operation of ATE and its limitations.

In accordance with the present invention a circuit tester for testing board mounted components includes:
means for applying test signals to the circuit,
means for receiving response signals from the circuit,
means for applying a pattern of test signals sufficient to test a device and assessing the response,
means for identifying tests which overdrive outputs of other devices,
means for enforcing a maximum test duration to ensure such an other device is not damaged by heating,
means for identifying test patterns wherein a device is overdriven repeatedly,
means for establishing a test parameter list for such a test,
means for establishing a cooling interval from said test parameter list to be applied before the next overdriving test can be safely performed, and
means for delaying such a test for at least such an interval;
wherein the valuee of at least a first parameter in the test parameter list is measurement derived from a board of the type under test, and the valuee of at least a second parameter in the test parameter list is dependent upon a subsequent test.

It will be appreciated that the present invention represents a fundamental departure from prior art ATE since its configuration permits both use of board specific data during test specification or testing itself and the use of test interaction in the establishment of the cooling interval, by means of a parameter list for each test.

Advantageously a first parameter is measurment derived from either a previously tested or known to be good board or a historical derivation from such boards, or preferably from the actual board under test. This allows cooling intervals to be specified for the configured devices and shows considerable improvement in the shortening of cooling intervals compared with prior art ATE in which intervals must be based on worst case values for isolated devices. Thus for example, the actual duration of a cooling interval will not be precisely specified in advance of a test, but will be dependent upon the actual tests performed as testing proceeds. A preferred implementation of this feature is to specify several cooling intervals a different one of which may be selected in the event of measurement of a short test, a normal test, a long test or a maximum duration test.

Additionally or alternatively a parameter may be the actual overdriving voltage used in a test, which may itself be selected based on previous measurements.

Additionally or alternatively a measured parameter may be overdriving current measured on the actual or a typical circuit board.

It will now be realised that unlike prior art ATE where the test specification fixes all cooling interval durations in advance of testing, in some forms of the present invention duration may vary between tests on boards of the same type.

In order that features and advantages of the present invention may be appreciated, some embodiments will now be described, by way of example only, and with reference to the accompanying diagrammatic drawings, of which:

FIG. 1 represents a part of a circuit to be tested, and
FIG. 2 to 5 represent device temperature time histories In a part of a circuit to be tested by ATE (FIG. 1) outputs of D-type flip-flops making up a device 10 are connected to NAND-gate inputs making up part of a device 11. The connection pattern between devices is clearly shown and is made up of device pins shown diagrammatically in outline (such as pin 12 of device 10) and printed cicruit board tracks shown solidly, such as track 14. The device 10 will be recognised by those familiar with integrated circuts as a Transistor-Transistor Logic device, designated 7474, and device 11 as a device designated 7400. It will be appreciated that there are also power supply line connection to both devices, which are omitted from the figure for clarity.

The D-type flip-flops of device 10 each have a Clock Input ($C_A$, $C_B$) a Data Input ($D_a$, $D_b$) and a latched output ($Q_A$, $Q_B$). Additionally the flip-flops are provided with a Set Input ($PRE_A$, $PRE_B$) allowing the respective Data Output to be set high, and a Reset Input ($CLR_A$, $CLR_B$) allowing the Data Output to be reset low. In respect to the PRE and CLR inputs the truth table for each device is:

| PRE | CLR | Q |
|---|---|---|
| 0 | 0 | 1 |
| 0 | 1 | 1 |
| 1 | 0 | 0 |
| 1 | 1 | X | where X indicates an indeterminate state for a directly applied input.

Each NAND gate ($G_A$, $G_B$) of device 11 has two inputs ($I_{1A}$, $I_{2A}$) ($I_{1B}$, $I_{2B}$) and an output (A,b) as well as power supply corrections (not shown). The input/output truth table for each gate is:

| $I_1$ | $I_1$ | A,B |
|---|---|---|
| 0 | 0 | 1 |
| 0 | 1 | 1 |
| 1 | 0 | 1 |
| 1 | 1 | X |

For a circuit configured in accordance with FIG. 1, the outputs (A, B) of the NAND device may be specified as:

$A = (\overline{Q_A \cdot CLR})$, and $B = (\overline{A \cdot Q_B})$, and

For which the truth table is:

| PRE | CLR | $Q_A$ | A | $Q_B$ | B |
|---|---|---|---|---|---|
| 0 | 0 | 1 | 1 | 1 | 0 |
| 0 | 1 | 1 | 0 | 1 | 1 |
| 1 | 0 | 0 | 1 | 0 | 1 |
| 1 | 1 | X | X | X | X | and of which the right hand three columns represents the operation of NAND gate $G_B$ of device 11.

In order to test the operatin of gate $G_B$ of device 11 it must be exercised through its entire truth table. From the above truth table it may be seen that three out of the four possible input combinations may be directly exercised using PRE and CLR flip-flop inputs only. Thus in ATE nail contact is made with driving nails 15, 16, 108 to circuit board tracks 14, 17 so that the required PRE and CLR inputs may be established. The last remaining input state (1,1) cannot be established by inputs to PRE and CLR alone. A LOW input to IB2 may be established by applying PRE=1 and CLRLb L32 0 via nails 15 and 16 respectively. However since this input combination gives A=1, then a LOW input cannot be applied to $I_{2B}$, except by overdriving the output of NAND gate $G_A$ via driving nail 18 to overcome the otherwise HIGH output A of gate $G_A$. Overdriving the output G, carries with it all the attendant dangers of device overdriving as herein and elsewhere described.

In the test specification the following schedule 104 for testing gate $G_B$ might be specified. In the schedule it will be noted that in between each test the flip-flop inputs are returned to their inactive state by means of applying PRE=1 and CLR=1.

| STEP | DRIVING PRE | STATES CLR | A | PASS STATE |
|---|---|---|---|---|
| 1. RESET | 1 | 1 | Z | X |
| 2. TEST | 0 | 0 | Z | 0 |
| 3. RESET | 1 | 1 | Z | X |
| 4. TEST | 0 | 1 | Z | 1 |
| 5. RESET | 1 | 1 | Z | X |
| 6. TEST | 1 | 0 | Z | 1 |
| 7. RESET | 1 | 1 | Z | X |
| 8. TEST | 1 | 0 | 0* | 1 |

In the above table input A is applied via overdriving nail 18. Z indicates that the nail is in a high-impedance state or disconnected and * that an overdriving input is applied. The timing, effects and dangers of overdriving output A will now be considered in more detail.

Curve 20 (FIG. 2) plots the temperature of device 11 when output A is overdriven between Temperature axis T (21) as ordinate and time axis $\tau$ (22) as absicca. The device is heated from an initial or ambient temperature $T_{amb}$ for the duration of the overdriving test $\tau_{test}$ to reach a temperature $T_{test}$ (22). Taking a worst case example, the next test specified is found to also overdrive output A of device 11, and requires a duration $\tau_{test\ next}$. Since the heating profile of the device is known by virtue of a heating model 109, a temperature T next may be specified, which is the highest temperature at which the next test may be commenced without the temperature exceeding $T_{max}$, the absolute maximum allowable temperature of device 11. Based on knowledge of a cooling model for the device 11, a period $\tau_{cool}$ may be computed, which is the period required for the device to cool to $T_{next}$. The next test, if performed directly afterwards, would cause the device 11 to reach its absolute maximum value 23 after the test period $\tau_{test\ next}$.

Associated with each test is a period $\tau_{max}$ which represents the maximum period for which a test can be run without exceeding device absolute maximum temperature. It is the practice in ATE for this time to be assessed and arrangements made for the test to be aborted before the period is exceeded, for example by means of an interupt timer loaded with a count representing $\tau_{max}$ which is counted down during the test to interupt the test on overflow. Were device 11 to reach $T_{max}$, then a period $\tau$ cool max would be required for cooling before a subsequent test could be performed.

A curve 30 (FIG. 3) shows a typical plot of temperature against time for three consecutive overdriving test performed by ATE configured in accordance with the present invention. During the first test period $\tau_1$, the device reaches a temperature 31, from a starting temperatue T start. In ATE a test parameter list is maintained for the test which includes a measured parameter of test duration $\tau_1$ obtained from a previously tested board. Also included is the final temperature attained 31 and the maximum temperature at which the next test may be commenced $T_{n2}$.

Since the attained temperature 31 is below $T_{n2}$, the second test may be commenced immediately, and the device heats to a temperature 32 at the end of this test, which lasts for a period $\tau_2$. The test parameter list 105 for this test includes measured period $\tau_2$ as well as the maximum safe test temperature for the third test $T_{n3}$. Since attained temperature 32 is above $T_{n3}$ cooling is required and a delay of interval $\tau_{cool\ 2}$, computed in accordance with a device cooling model, enforced to allow cooling to $T_{n3}$ before the test is commenced. After the third test, which lasts for a period $\tau_3$, the device reaches its absolute maximum at 33.

In order that advantages of the present invention may be further appreciated, the performance of the ATE just described will be compared with the performance of prior art ATE.

In prior art ATE, a parameter list for each test is not maintained and therefore the temperature attained during a test cannot be used to assess the need for cooling, and the duration of any required delay. Thus as previously described a temperature assumption has to be made, and the only unconditionally safe assumption is that a device will reach its absolute maximum temperature upon completion of each test. This assumption therefore requires insertion of a maximum cooling time ($\tau_{coolmax}$). Since this assumption is not based upon information derived from previous or past tests, a maximum cooling delay must be enforced before each overdriving test. Taking the same test example as described with reference to FIG. 3, in a first test a device reaches a temperature 41 (FIG. 4) during a test interval $\tau_1$. Before the second test is performed, the device is allowed to cool during a period $\tau_{coolmax}$ to a termpature 42. This cooling period ($\tau_{coolmax}$) is that which would have been sufficient to cool the device from its absolute maximum temperature 43 to a safe starting temperature 44. The second test proceeds during an interval $\tau_2$ to raise the temperature of the device to a temperature 45. Again before, third test can proceed, a cooling delay of $\tau_{coolmax}$ is enforced. From the resulting curve 40 it will be noted that the test device is cooled unnecessarily.

It will be immediately appreciated that the present invention has reduced the time required to perform the three tests by a period 't', which is of significant length, and leads to a marked improvement in throughput. The improvement arises by virtue of:

(i) elimination of unnecessary cooling intervals;
(ii) reduction of cooling intervals to those required for the attained temperature, and
(iii) operation of the device towards the upper limit of its operational temperature range, where cooling profiles are steeper, and hence a given temperature fall attained more quickly.

The improvement is made possible by the specification of a temperature parameter for each test, enabling optimized cooling delays to be enforced. The temperature parameters may be derived by exercising a device heating model in test specification, or preferably on-line during the test so that a value is available for the current value of device temperature, which may be transferred to or maintained as the test parameter list value 105. Thus the enforced cooling delay 106 is based upon a representative device temperature attained at the end of a test, rather than a default or percentage (mark-space) delay as in prior art ATE.

It will be realised that the device temperature may only be accurately computed if the actual start temperature is known. Where an actual ambient temperature measurement cannot be made, an assumed ambient may be used. For example prior to the first test only, a maximum cooling-interval ($\tau_{coolmax}$) sufficient to cool the device from its absolute maximum temperature may be enforced. Generally, this will cool the device to a temperature well below that required to safely conduct the first test. However, if this higher temperature is used as a first test parameter assumed starting temperature, all subsequent temperature will actually be lower than computed, and all devices may be tested safely. Thus for a test starting from a temperature 34 (FIG. 3), the actual temperature profile might be as shown by a trace 35, whereas the test parameters reflect the higher assumed profile 36. It will be appreciated that even with this initial over estimate of starting temperature, resulting in cooling delay being longer than actually required, it still shows a considerable test time improvement over the prior art, with its repeated worst case assumptions.

In a test specification 103 for a circuit involving for example purely combinational logic, a cooling delay derived from another board will be adequate, since no significant variation is to be expected between boards. However, where devices having a varying settling time, for example a non-presettable counter which must be clocked to zero before testing, are in a circuit to be tested, preferably parameters are based on measurement made on that actual board under test.

In a circuit arrangement of slow devices similar to that considered with reference to FIG. 1, supposing a flip-flop having output $Q_B$ of device 10 is slow to clear after application of an input CLR=0, a test (for gate B of device 11) might proceed as follows:

| TEST STEP | APPLIED SIGNALS | PASS CONDITION | EXPECTED TIME | ACTUAL TIME |
|---|---|---|---|---|
| Prepare | PRE = 1<br>CLR = 1 | | 100 us | 100 us |
| 1. | PRE = 0<br>CLR = 0<br>A = Z | B = D | 10 us | 8 us |
| Prepare | PRE = 1<br>CLR = 1 | | 100 us | 100 us |
| 2. | PRE = 0<br>CLR = 1<br>A = Z | B = 1 | 10 us | 9 us |
| Prepare | PRE = 0<br>CLR = 0 | | 100 us | 100 us |
| 3. | PRE = 1<br>CLR = 0<br>A = Z | B = 1 (0-1) | 10 us | 17 us |
| Prepare | PRE = 1<br>CLR = 1 | | 100 us | 100 us |
| 4. | PRE = 1<br>CLR = 0<br>A = 0* | B = 0 (1-0) | 10 us | 20 us |

The test step is passed when the expected B output is measured by measurement nail 19 (FIG. 1), or when a transistion to the expected level occurs (as in tests 3 and 4). Since the D type flip-flop device is slow to clear, CLEARED tests 3 and 4 overrun the expected time. Test 3 should present no problem, but Test 4 is an overdriving test, which may be problematic, since this test is followed by another overdriving test, as already described.

In accordance with the present invention the actual running time of the test, 20 us, is entered as a test parameter 105 and used in a heating model 107 to provide an attained device temperature. Subsequently a cooling model is exercised to enforce a cooling delay from this attained temperature to the safe temperature for commencement of the next test.

In ATE it is often preferred to do as little computation as possible during an actual test, transferring as much of the workload as possible to an off-line computation during the test specification phase. The present invention may be applied in this way by for example computing cooling delays to be enforced if particular test run times are encountered in practice. Then all that is required on line is a run time measurement, comparison and interval selection 106.

In an embodiment of the present invention for each relevant overdriving test, a predicted duration is stored as a test parameter. This duration may be computed, measured on a representative board or derived by averaging the durations of actual tests performed on several boards. Based on this predicted duration, a heating model is exercised to determine an attained temperature, and a cooling model exercised to determine the cooling delay required before a next overdriving test may be safely commenced. This predicted cooling delay is stored in machine memory. Additionally computed is the cooling time from absolute maximum allowable device temperature, $T_{coolmax}$.

During testing of an actual device, the test time is interrogated. If the actual test time is less than or equal to predicted test time, then the predicted cooling delay is enforced before the next overdriving test. Should however actual test duration exceed the predicted duration, $\tau_{coolmax}$ is enforced. Thus it will be realised that the advantages of the present invention may be achieved without significant computational load during testing and with measurement of the single parameter of test time.

For a temperature history 50 of a typical device test (FIG. 5), a first test causes a temperature rise to a temperature 51. Since the attained temperature is above the safe start temperature for a next test $\tau_{n2}$, a cooling delay is required. Associated with the test is a predicted test duration $\tau_{1p}$. Since the actual test duration $\tau_1$, is less than predicted, a cooling delay $\tau_{cool\,p}$ is inserted before the next test. The period $\tau_{cool\,p}$ sufficient for the device to cool from a temperature 52 to $\tau_{n2}$, the temperature at which the second test may be safely commenced. It will be appreciated that the actual device under test will infact cool to a temperature 53, below $T_{n2}$. A second test is initiated, which causes heating to a temperature 54 during a test interval $\tau_2$. Since $\tau_2$ exceeds predicted interval $\tau_{2p}$ for the second test a cooling delay $\tau_{coolmax}$ is enforced, sufficient to cool from device absolute maximum temperature to a temperature $T_{n3}$, that at which a third test may be safely commenced. In fact, since the device was not at its absolute maximum allowable temperature after the second test, a lower temperature 55 will be reached.

Although it is heating which actually causes damage to a device, it will be noted from the foregoing device heating models, that the heating effect increases with overdriving voltage. This may to advantge be included in the test parameter list for tests performed in accordance with the present invention. The overdriving voltage may be an actual value measured during a test or a value specified in a test definition. Since the invention provides means for optimising cooling delay based upon actual overdriving voltage, the applied voltage itself may be selected 106 to suit a particular test, allowing reduced applied voltage (and hence less device heating stress) compared with prior art ATE.

In an embodiment of the present invention, the test parameter list carries an overdriving voltage to be used for each test, together with a corresponding cooling delay. These parameters are derived during the test definition phase, for example as follows.

The test schedule is inspected for an overdriving test, and with a known to be good circuit board in the fixture, a confirmation test performed of an overdriving test with full overdriving voltage applied. The test is then repeated with applied overdriving voltage reduced by 10%. If the test is still passed the test is repeated again with a 10% reduction in overdriving voltage, and so on until failure occurs, whereupon the lowest value of overdriving voltage giving a successful test is entered in the test parameter list as the overdriving voltage to be used when that test is performed on actual production circuit boards. It will be appreciated that the overdriving stress applied during the test is thereby reduced compared with the same test with the full overdriving voltage applied.

In tests for which a cooling delay is required, the specified reduced value of overdriving is used when the heating model is exercised to define the interval required. Thus the invention provides not only lower overdriving stress, but also a reduced overall test time. In ATE in accordance with the present invention reduced overdriving voltages and where appropriate cooling delay are held as parameters for each test. In operation the majority of boards may be successfully tested with the reduced values. However, there may be a minority of in specification boards which fail the reduced votage test. ATE may be programmed in the test definition to repeat overdriving tests at full overdriving voltage in the event of a failure. Following such a repeat test, a full length cooling interval is required, and so for each test the cooling delay corresponding to application of the full overdriving voltage is held as an additional test parameter for use in the event of a repeated test. In alternative embodiments a plurality of cooling invervals corresponding to various overdriving voltages may be stored as test parameters. Thus in the event of failure of a reduced overdriving voltage test, the test is repeated with an increased overdriving voltage (and corresponding delay, where applicable) until either a test is successfully performed, or full overdriving voltage is reached, whereupon a test failure is recorded.

In ATE where computational resources are available during actual testing, the overdriving voltage used for any particular test may be regarded as a current best estimate, and a histogram of previous test results used to improve the estimate. Typically an algorithim which rapidly homes to the lowest applied voltage giving a successful test in most cases is preferred so that both undue device stress and undue test repeats are avoided. In such ATE, corresponding cooling intervals where required may be computed during testing, or a suitable interval value selected from a parameter look up table defined in the test specification phase, but exercising the heating model for various values.

Another parameter which may be measured 108 to influence the selection of optimized cooling intervals is overdriving current. For each overdriving test, the actual current injected or sunk may be measured, alternatively a representative measurement may be obtained from a known to be good board during test definition, or an average of such measurements for an integrated circuit in which several devices are overdriven simulataneously, the sum of the individual device overdriving currents will sum in a power supply bond wire. It is known that bond wire heating is a potential cause for failure and a bond wire heating model may be exercised to establish safe cooling delays for various possible currents. Unfortunately since current flowing to or from the power supply rails for an individual device cannot be measured, an optimum cooling interval cannot be selected.

However, in accordance with the present application the overdriving currents of individual devices are separately measured, and a summed value used in computations. Again, these values may be measured for the actual board under test and an appropriate interval selected from previous computed values. The individual values may be obtained by virtue of other overdriving tests where packaged devices are exercised alone, or a special overdriving measurement test may be inserted in the test schedule.

We claim:

1. An improved method of testing devices of a circuit comprising interconnected devices to be tested on a circuit board by a schedule of tests, each test comprising applying a pattern of test signals to the circuit sufficient to test a device, and assessing the response thereto, the improvement comprising the steps of:
   identifying tests during which an output of an interconnected device is overdriven;
   enforcing a maximum test duration for such tests such that said interconnected device is not damaged;
   identifying tests during which an output of an interconnected device is overdriven repeatedly;
   establishing a list of test parameters for such a test, said parameter list being chosen so that safe limits for overdriving are definable therefrom;
   performing a measurement on a circuit of the type under test of a characteristic of an interconnected device of that circuit and deriving at least one of the test parameters of said test parameter list therefrom;
   establishing for said test from said test parameter list in accordance with said safe limits an interval to be applied before a subsequent overdriving test can be safely performed on a previously overdriven device and
   delaying said subsequent test for at least said interval.

2. A method of testing devices as claimed in claim 1 and including the step of performing said measurement of said characteristic on the circuit under test.

3. A method of testing devices as claimed in claim 2 and including the step of performing said measurement as part of a preceding test.

4. A method of testing devices as claimed in claim 1 and wherein said step of performing a measurement comprises measuring a test duration.

5. A method of testing devices as claimed in claim 1 and including selecting between a first cooling interval and a second cooling interval of different length.

6. A method of testing devices as claimed in claim 5 and including the step of selecting a predicted cooling interval as said first cooling interval whenever a test duration is less than or equal to a predicted test duration, and an interval being that which said overdriven device requires to cool from its absolute maximum temperature to a temperature within safe limits for said subsequent overdriving test as said second interval.

7. A method of testing devices as claimed in claim 1 further comprising the step of including an overdriving voltage as a test parameter.

8. A method of testing devices as claimed in claim 7 and wherein said step of performing a measurement comprises measuring an overdriving voltage.

9. A method of testing devices as claimed in claim 7 and including the steps of establishing said overdriving voltage by reducing said voltage on a known to be good board until a test failure occurs and selecting a minimum test passing voltage.

10. A method of testing devices as claimed in claim 9 and including the step of, in the event of failure of an actual test, applying an increased overdriving voltage in a repeat test.

11. A method of testing devices as claimed in claim 1 and wherein said step of performing a measurement comprises measuring an overdriving current.

12. A method of testing devices as claimed in claim 11 and including the step of computing total overdriving current for a device from summation of individually measured overdriving currents for the overdriven outputs of said device.

* * * * *